United States Patent [19]

Miele et al.

[11] Patent Number: 5,653,929
[45] Date of Patent: Aug. 5, 1997

[54] PROCESS FOR PREPARING A PHOTOPOLYMERIZABLE PRINTING ELEMENT

[75] Inventors: Emil Frederick Miele, Howell; Robert S. Hutnich, Morganville, both of N.J.

[73] Assignee: E. I. Du Pont de Nemours and Company, Wilmington, Del.

[21] Appl. No.: 519,377

[22] Filed: Aug. 25, 1995

[51] Int. Cl.$^6$ ............... B29C 43/22; D02J 1/14; B32B 31/00
[52] U.S. Cl. ............... 269/173.1; 430/271.1; 430/273.1; 430/935; 156/295; 156/308.4; 156/324; 156/555; 269/175; 269/280
[58] Field of Search ............... 430/271.1, 273.1, 430/935; 156/295, 308.4, 324, 555; 264/280

[56] References Cited

U.S. PATENT DOCUMENTS

| | | | |
|---|---|---|---|
| 2,922,190 | 1/1960 | Higgins, Jr. | 264/280 |
| 3,139,365 | 6/1964 | Andrews | 156/295 |
| 4,302,528 | 11/1981 | Sano et al. | 430/273.1 |
| 4,427,759 | 1/1984 | Gruetzmacher et al. | 430/273 |
| 4,451,320 | 5/1984 | Marvel | 156/555 |
| 4,622,088 | 11/1986 | Min | 430/273.1 |
| 5,039,471 | 8/1991 | Yokota et al. | 264/280 |
| 5,169,583 | 12/1992 | Moriguchi et al. | 264/280 |
| 5,173,239 | 12/1992 | Gunter, Jr. et al. | 264/288.4 |
| 5,300,177 | 4/1994 | Downing et al. | 156/555 |

FOREIGN PATENT DOCUMENTS

| | | | |
|---|---|---|---|
| 571890 | 4/1959 | Belgium | 264/280 |
| 686454 | 5/1964 | Canada | 264/280 |
| 56-19742 | 2/1981 | Japan | 156/555 |

*Primary Examiner*—Glenn A. Caldarola
*Assistant Examiner*—J. Pasterczyk

[57] ABSTRACT

A process for preparing a photopolymerizable printing element includes feeding a layer of a photopolymerizable composition, calendering the layer to form a web, applying tension to the web, and cooling the web wherein during cooling, a gripping force is applied at side edges of the web. The application of the gripping force to the web substantially reduces non-uniformities in the thickness of the photopolymerizable layer.

13 Claims, 3 Drawing Sheets

PROCESS FOR PREPARING A PHOTOPOLYMERIZABLE PRINTING ELEMENT

BACKGROUND OF THE INVENTION

1. Field of the Invention

This invention relates to a process for preparing a photopolymerizable printing element.

2. Description of the Prior Art

Flexographic printing plates are well known for use in printing, particularly on surfaces which are soft and easily deformable, such as packaging materials, e.g., cardboard, plastic films, etc. Flexographic printing plates can be prepared from photopolymerizable compositions, such as those described in U.S. Pat. Nos. 4,323,637 and 4,427,749. The photopolymerizable compositions generally comprise an elastomeric binder, at least one monomer and a photoinitiator. Photosensitive elements generally have a photopolymerizable layer interposed between a support and a coversheet or multilayer cover element. Upon imagewise exposure to actinic radiation, polymerization, and hence, insolubilization of the photopolymerizable layer occurs in the exposed areas. Treatment with a suitable solvent removes the unexposed areas of the photopolymerizable layer leaving a printing relief which can be used for flexographic printing.

The flexographic photopolymer compositions can be formed into sheets or layers by several known methods such as solvent casting, hot pressing, calendering and extrusion. A preferred method of manufacturing flexographic printing elements is by extrusion calendering of the photopolymer composition. In extrusion calendering, the printing element is prepared by passing a mass of hot photopolymer into an extrusion die forming a layer, passing the layer into nip of a calender and, while still hot, calendering the photopolymer composition between two flat surfaces, generally two flexible films, to form a multilayer web. The films can include multiple layers or compound films. A film bearing a thin layer of flexible, polymeric film is an example of a compound film. After extrusion and calendering at elevated temperatures, the web is held in tension in the film transport direction by a pair of nip rollers while the multilayer web is cooled, for example, with blown air. The printing element as a multilayer web can be cut into suitable size sheets.

A problem associated with the extrusion calendering of photopolymeric layers is that while the web is in tension and being cooled, non-uniformities in the thickness of a photopolymer layer can occur across the web, i.e., cross-web or transverse direction, for the length of the web in the film transport direction. For example, the web can have areas in the film transport direction where the thickness of the photopolymer layer is greater or less than desired alternating with areas where the thickness of the photopolymer layer is on target. Transverse non-uniformity in thickness of the photopolymer layer which runs the length of the web is generally referred to as laning. Non-uniform thickness of the photopolymer layer typically causes the printing element to not lie flat and thus a mask or phototool used during exposure does not contact the element properly and vacuum is not sufficient to improve contact. Flexographic printing plates thus prepared from printing elements having non-uniform thickness results in poor relief images in the plate and misregistration of printed images.

Thus, it is an object of this invention to provide an improved process for the preparation of photopolymerizable printing elements in which the thickness of the photopolymer layer does not change and is substantially uniform across the web.

SUMMARY OF THE INVENTION

In accordance with the invention there is provided a process for preparing a photopolymerizable printing element comprising:

(a) feeding into a nip of a calender, a layer of a photopolymerizable composition containing at least one elastomeric binder, at least one ethylenically unsaturated monomer, and a photoinitiator;

(b) calendering the layer of the photopolymerizable composition between a support and a cover element to thereby form a web having a first side edge, a second side edge and a top side;

(c) applying tension to the web with a pair of tension nip rollers to thereby move the web in a path in a film transport direction; and (d) cooling the web prior to the tension nip rollers; wherein the improvement comprises, during cooling step (d);

(e) applying a first force to the web which comprises;
  (e1) gripping the first side edge of the web with a first pair of nip rollers, each of the rollers having an axis and a grip end;
  (e2) gripping the second side edge of the web with a second pair of nip rollers, each of the rollers having an axis and a grip end;

wherein the first pair of nip rollers and the second pair of nip rollers are aligned perpendicular to the film transport direction; and wherein the axis of each of the first and second pair of nip rollers are skewed at an angle between 2 to 30 degrees from the perpendicular of the film transport direction and the grip end of each of the first and second pair of nip rollers are downstream of the film transport direction.

DETAILED DESCRIPTION OF INVENTION

Figure 1:
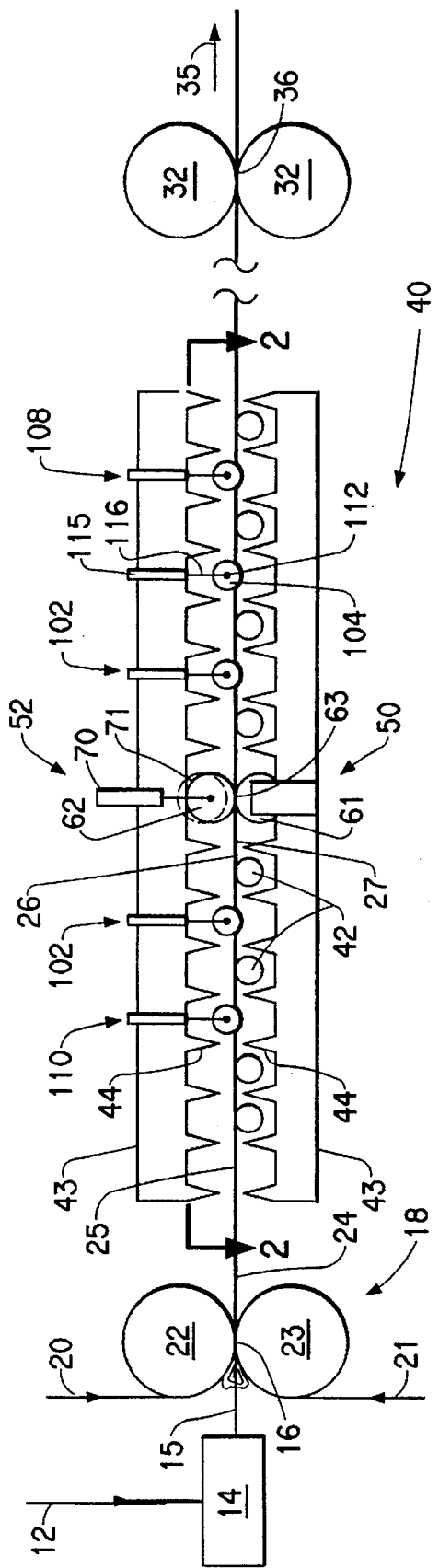
FIG. 1 is schematic illustration of the process of this invention for the preparation of photopolymerizable composition into a printing element showing the application of a first force and at least one second force to a web formed from the photopolymerizable composition with a support and cover element.

Throughout the following detailed description, similar reference characters refer to similar elements in all figures of the drawings.

The present invention is a process for preparing a flexographic printing element which includes feeding a photopolymerizable composition into an extruder to form a layer of the composition, calendering the layer to form a web, applying tension to the web in a film transport direction, and cooling the web wherein during cooling, applying a first force to the web is by gripping each side edge with nip rollers having an axis skewed at an angle from the perpendicular of a film transport direction. Preferably, in addition to applying the first force to the web, at least one second force is applied to the web perpendicular to the film transport direction.

PROCESS

Figure 2:
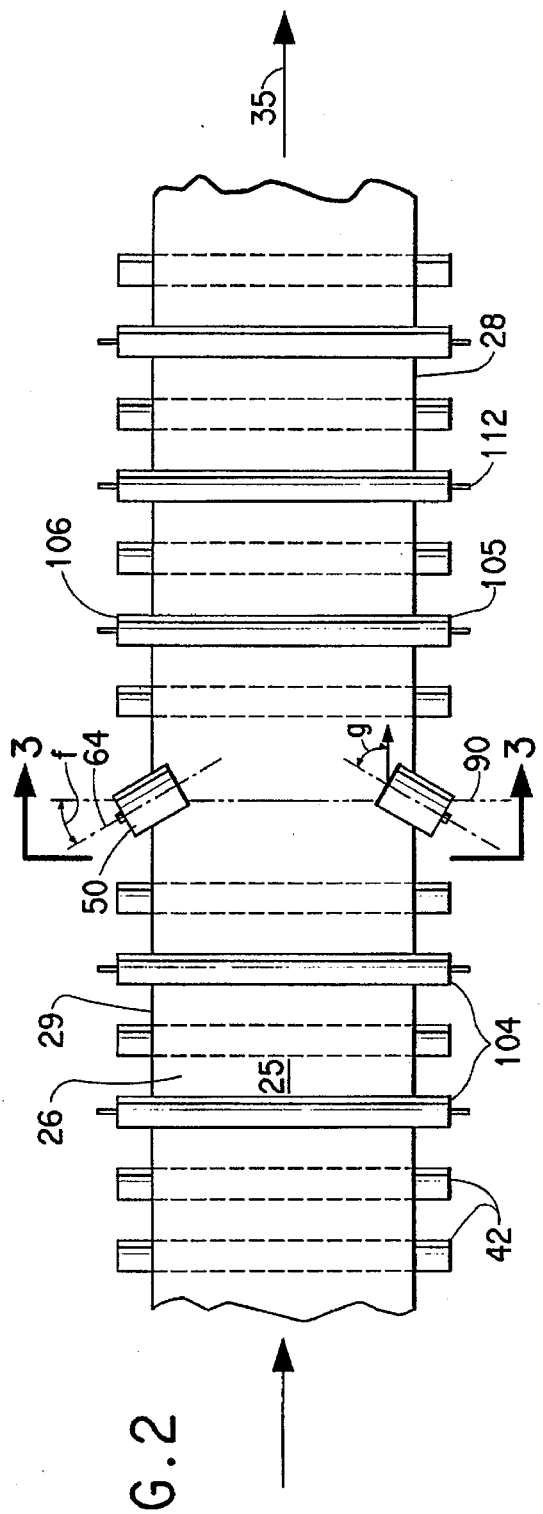
FIG. 2 is a schematic planar view taken along 2—2 of FIG. 1 showing the application of the first force at side edges of the web using nip rollers skewed at an angle and the application of the at least one second force perpendicular to the web.

Referring to FIGS. 1 and 2, a photopolymerizable composition which includes at least one elastomeric binder, at least one ethylenically unsaturated monomer and a photoinitiator is fed by one or more conduits 12 into an extrusion die 14. The extrusion die 14 forms a molten layer 15 of the photopolymerizable composition. The extrusion die 14 feeds the molten layer 15 into a nip 16 of a calender 18.

A support film 20 and a coversheet film 21 are supplied from a roll or other source (not shown) to the calender 18. A first calender roll 22 of the calender 18 carries the support film 20 about part of its outside surface into the nip 16 and the second calender roll 23 carries the cover sheet film 21 about part of its outside surface into the nip 16. For the purposes of this invention, it is not important which calender roll carries the support 20 and the coversheet film 21. The molten layer 15 is calendered while still hot to a desired thickness at the nip 16 between the support 20 and the coversheet film 21. Calendering the molten layer 15 forms a photopolymerizable layer 24 (not shown in detail) of particular thickness between the support 20 and the coversheet film 21 to form a web 25. The web 25 has a top side 26, a bottom side 27, a first side edge 28 and a second side edge 29. The web 25 also has a plane which is a surface of the top side 26 and/or the bottom side 27. The average surface temperature, T1, of the web 25 as it leaves the calender 18 ranges from about 185° to 260° F.

A pair of tension nip rollers 32 downstream of one or more cooling zones applies tension to the web 25 and moves the web 25 in a path in a film transport direction as indicated by arrow 35. The film transport direction 35 of the web 25 is the direction the web travels from the calender 18 to the tension nip rollers 32. The tension applied to the web 25 by the tension nip rollers 32 is sufficient to transport the web 25 through the one or more cooling zones without stretching the web 25. Only one of the tension nip rollers 32 is driven. The other tension nip roller rotates due to contact with the outside surface of the driven nip roller or with the web 25 as it transports through a nip 36 of the tension nip rollers 32. The driven tension nip roller is driven by conventional means. The average surface temperature, T2, of the web 25 as it exits the tension nip rollers 32 ranges from 60° to 75° F.

After calendering, the photopolymerizable layer 24 is cooled by passing the web 25 through at least one cooling zone, preferably 2 or more cooling zones. In FIG. 1, a first cooling zone 40 is shown. The web 25 is supported on the bottom side 27 during transport in the cooling zone 40 by multiple spaced idler rollers 42. The idler rollers 42 are fixed in position perpendicular to the film transport direction 35 of the web 25. Each end of the rollers 42 are supported on a frame (not shown) of a housing (not shown) for the cooling zone 40. The cooling zone 40 includes plenums 43 having nozzles 44 which direct air on the top side 26 and the bottom side 27 of the web 25 to cool the web 25. The air incoming to the cooling zone 40 is preferably cooled or chilled to increase the cooling rate of the web 25 and the air warmed by heat transfer with the web 25 is extracted from the cooling zone 40. The first cooling zone 40 is one in which the initial period of heat transfer from the web 25 occurs. The average surface temperature, T3, of the web 25 as it leaves the first cooling zone 40 is typically between about 95° F. to about 170° F.

For the purposes of this invention, the initial period of heat transfer, i.e., initial period of cooling, is determined by a relationship of the average surface temperatures of the web 25 at particular locations during the process of preparing the element. The web 25 upon passage through the first cooling zone 40, has cooled to at least half of the cooling which occurs to the web 25 between the calender 18 and the tension nip rollers 32, based upon the average surface temperatures. The average surface temperature T3 of the web 25 leaving the first cooling zone 40 is the average surface temperature T1 of the web 25 at the calender 18 reduced by (cooled to) at least half, preferably 70%, of the difference between the average surface temperature T1 of the web 25 at the end of calendering 18 and the average surface temperature T2 of the web 25 after passing through the tension nip rollers 32, that is, the relationship is $T3 \leq (T1-0.5(T1-T2))$, and preferably, $T3 \leq (T1-0.7(T1-T2))$. Thus, the average surface temperature, T3, of the web 25 as it leaves the first cooling zone 40 is less than or equal to 168° F., and preferably less than or equal to 131° F. The area of the web 25 from the exit of the calender 18 to about where the end of the initial cooling of the web 25 represented by T3, is where at least 50%, preferably 70%, of the heat transfer from the web 25 has been completed. Thus the heat transfer from the web 25 is represented by the above relationship of the average surface temperatures of the web 25.

Surface temperature of the web 25 at any location can be measured by conventional means including infrared sensors or contact pyrometers. The average surface temperature of the web 25 is substantially the average surface temperature of the photopolymerizable layer 24. The average surface temperature of the web 25 is determined by averaging multiple temperature readings in a central area of the web, at the same location (in the machine direction), e.g., at exit of calender rollers, and at the exit of nip rollers.

It is during this initial period of cooling, as determined by the temperature relationship above, that non-uniformities in the thickness of the photopolymerizable layer 24 across the web 25, i.e., cross web from the first side edge 28 to the second side edge 29, may occur. The direction from the first side edge 28 to the second side edge 29 of the web 25 is a cross web or transverse direction of the web 25. Preferably, the cross-web or transverse direction of the web 25 is perpendicular to the film transport direction 35. In particular, non-uniformities in the photopolymerizable layer 24 in the web 25 can form lanes along the film transport direction 35 in which the thickness of the photopolymerizable layer 24 is greater or less than desired. The lanes can alternate with lanes in which the thickness of the photopolymerizable layer 24 is on aim or is less than or greater (respectively) than desired. Non-uniformity in thickness of the photopolymerizable layer 24 in the transverse direction which runs the length of the web may also be known as tension neck-down laning.

Surprisingly and unexpectedly, it has been found that the application of a first force and optionally at least one second force to the web 25 in an area from the exit of the calender 18 to where at least 50%, preferably 70%, of the heat transfer is completed, improves the thickness uniformity of the photopolyerizable layer 24 in the cross-web direction. Thus the application of the first force and the optional second force occurs in an area from the exit of the calender 18 to where the average surface temperature T3 of the web is cooled between (T1−0.5(T1−T2)) to (T1−0.7(T1−T2)), i.e., about 170° F. to 95° F.

Figure 3:
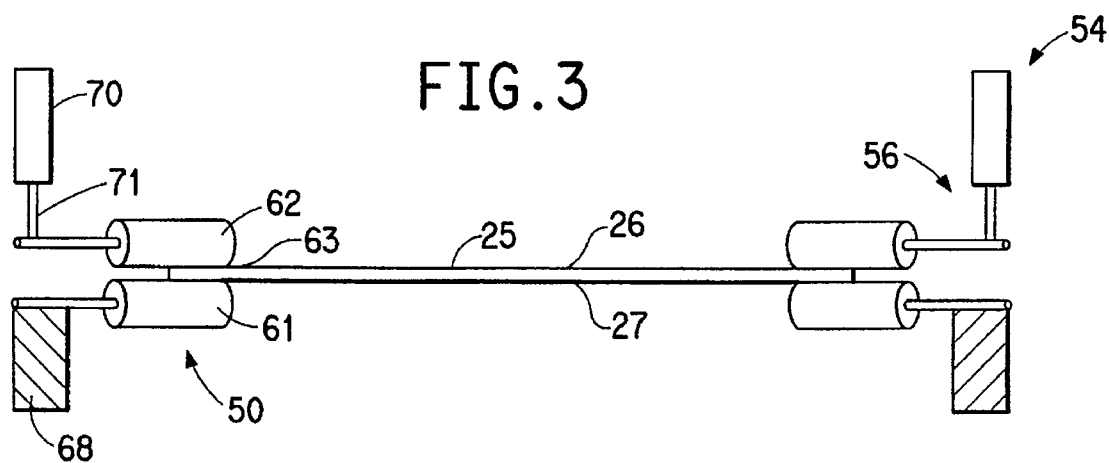
FIG. 3 is a schematic cross-sectional view taken along line 3—3 of FIG. 2 showing a first embodiment of a means for moving the nip rollers in a gripping nip roller assembly.

The application at the side edges 28,29 of the web 25 of the first force which includes gripping each of the side edges 28,29 with a pair of nip rollers 50 at a particular orientation to the web 25, during initial cooling, improves the thickness uniformity of the photopolyerizable layer 24 in the cross-web direction. Referring to FIGS. 1, 2, and 3 an embodiment of a means for applying the first force includes a gripping nip roller assembly 52 at each side edge 28,29 of the web 25. The gripping nip roller assembly 52 at a first side edge 28 is opposite the gripping nip roller assembly 52 at a second side edge 29 of the web 25 and are aligned perpendicular to the film transport direction 35. The gripping nip roller assembly 52 at the first side edge 28 provides a force which opposes a force applied by the gripping nip roller assembly 52 at the second side edge 29. The force applied by each pair nip rollers 50 in opposition to the other constitutes the first force applied to the web 25, and can be considered a force tangential to the plane of the web 25. The first force applied to the web 25 should be sufficient to retain the side edges 28,29 from neckdown, but not so much so as to deform the photopolymerizable layer 24 or impede the transport of the web 25. Retaining the side edges 28,29 of the web 25 minimizes or eliminates non-uniformities in the cross-web thickness of the photopolymerizable layer 24. One set of gripping nip rollers in the first cooling zone, i.e., one pair of gripping nip rollers 50 at each side edge 28,29, is sufficient to retain the side edges 28,29 and improve cross-web thickness uniformity. The first force applied to the web at each side edge 28, 29 is about 1 to 5 pounds per lineal inch of roller contacting the web 25.

It should be understood that the following description of the gripping nip roller assembly 52 for the first side edge 28 of the web 25 is applicable in kind for the gripping nip roller assembly 52 at the second side edge 29 of the web 25.

The gripping nip roller assembly 52 includes the pair of nip rollers 50, a means for moving 54 the nip rollers 50 into and out of nip contact with the side edge 28 of the web, a means for applying pressure 56 to at least one of the nip rollers 50, and a means for adjusting 58 an angular position of the nip rollers 50.

The pair of nip rollers 50 includes a first nip roller 61 which contacts the bottom side 27 of the web 25 and a second nip roller 62 which contacts the top side 26 of the web 25 to form a nip 63 and grip the side edge 28 of the web 25. The nip rollers 50 contact only a small portion of the side edge 28 relative to the entire width of the web 25. Materials suitable as nip rollers 50 are compounded rubbers and polymeric materials, preferably neoprene. The first and second nip rollers 61,62 each have a longitudinal axis 64. The axis 64 of the first nip roller 61 is vertically aligned with the axis 64 of the second nip roller 62 so that the rollers 61,62 are perpendicular or substantially perpendicular to the plane of the web 25. Each of the nip rollers 61,62 have a mount end 65 and a grip end 66 opposite the mount end 65. Each of the nip rollers 61,62 is mounted on a shaft 67 by conventional means so that the rollers 61,62 freely rotate to allow the web 25 to transport in the film transport direction 35. An end 67a of the shaft 67 of the first nip roller 61 is connected to a support member 68 mounted to the frame of the housing associated with the cooling zone 40. An end 67b of the shaft 67 of the second nip roller 62 is connected to the means for moving 54 the nip rollers 50. Although the first nip roller 61 and the second nip roller 62 are depicted in the FIG. 3 as being separately mounted to the frame, a second embodiment shown in FIG. 4 mounts the first and second nip rollers 61,62 together in a support assembly 69 which is mounted to the frame.

The gripping nip roller assembly 52 includes the means for moving 54 the nip rollers 50 into and out of nip contact with the web 25. The means for moving 52 the nip rollers 50 is useful for accommodating the gripping nip roller assembly 52 to the manufacture of various products having a different thickness of the photopolymerizable layer 24 and for inactivating the gripping nip roller assembly 52 if it is not needed. Preferably, the means for moving 54 the nip rollers 50 into and out of nip contact with the web 25 is a pneumatic cylinder 70 having a piston 71. In a first embodiment shown in FIGS. 1 and 3, the first nip roller 61 does not move into and out of contact with the bottom side 27 of the web 25, but is fixed. The cylinder 70 is mounted to the frame and the piston 71 is connected to the end 67b of the shaft 67 of the second roller 62. The piston 71 of the cylinder 70 moves the second nip roller 62 into contact with the top side 26 of the web 25 to form the nip 63 with the web 25 between the first and second nip rollers 61,62. The piston 71 of the cylinder 70 retracts to move the second nip roller 62 out of nip contact (retracted position as shown in phantom in FIG. 1) with the top side 26 of the web 25. The first nip roller 61 acts similar to an idler roller 42 by the contacting or occasionally contacting and so by supporting the web 25 when the second nip roller 62 is retracted from the top side 26.

Figure 4:
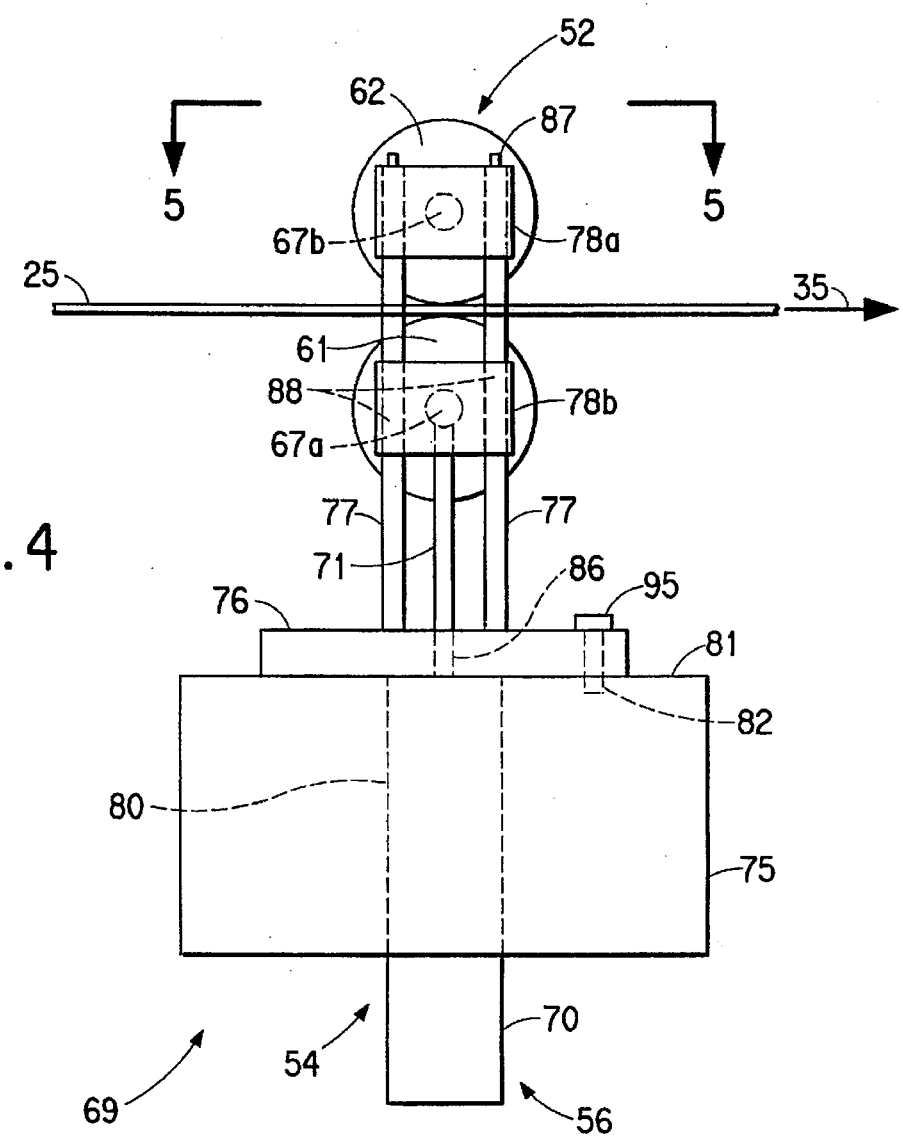
FIG. 4 is a side view of a second embodiment of the means for moving the nip rollers in the gripping nip roller assembly.
Figure 5:
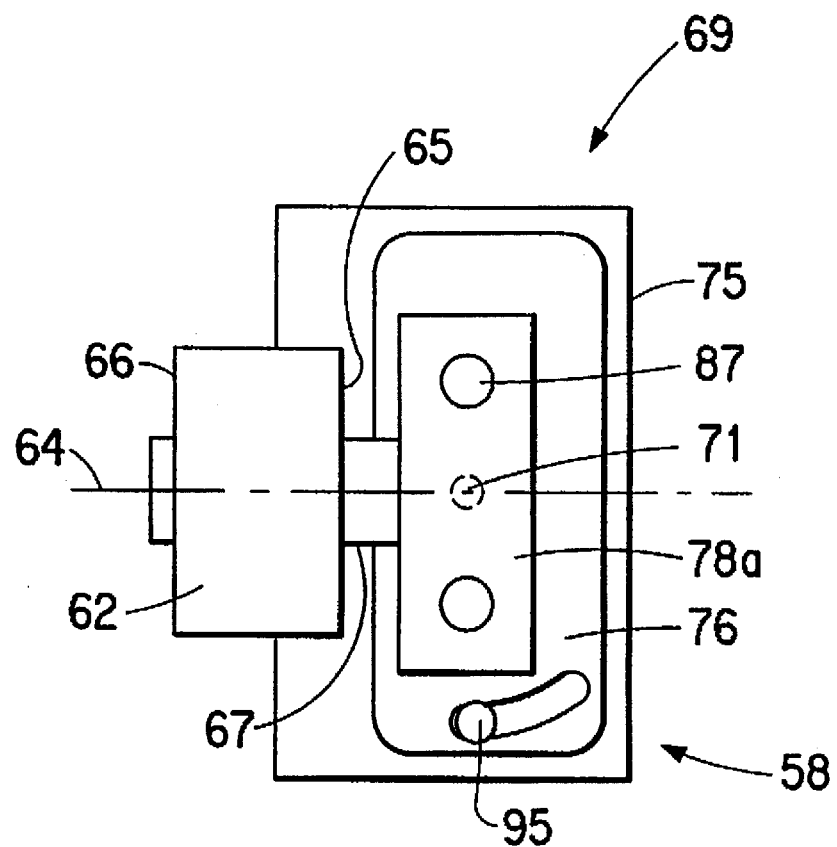
FIG. 5 is a top view taken along 5—5 of FIG. 4 of a means for adjusting the angular position of the pair of nip rollers showing a slot for adjusting the angle of the rollers.

Referring to FIGS. 4 and 5, in a second embodiment for the means for moving 54 the nip rollers 50 the second nip roller 62 is fixed and the first nip roller 61 is connected to the piston 71 of the cylinder 70 to move into and out of contact with the web 25. In this embodiment, the supporting assembly 69 supports the gripping nip roller assembly 52 including both the first nip roller 61 and the second nip roller 62. In this embodiment, the support assembly 69 includes a support block 75, an adjustable plate 76, two upright members 77, and a block 78b,78a associated with each of the nip rollers 61,62, respectively. The support block 75 is mounted to the frame. The support block 75 has a cavity 80 in which the cylinder 70 is securely mounted. The piston 71 of the cylinder 70 passes through the cavity 80 to a top side 81 of the support block 75. The support block 75 also has a hole 82 on the top side 81. The adjustable plate 76 resides on the top side 81 of the support block 75. The adjustable plate 76 has a slot 85 and a passage 86 for the piston 71. The two upright members 77 are mounted to the adjustable plate 76. The shaft end 67b of the second nip roller 62 is coupled to the block 78a. The block 78a is fixed to each of the two upright members 77 by means of a screw or bolt 87. The shaft end 67a of the first nip roller 61 is connected to a slideable block 78b. The slideable block 78b has two passages 88 in which each of the upright member 77 resides. The piston 71 of the cylinder 70 passes through the passage 86 in the adjustable plate 76 and is coupled to the slideable block 78b. Thus when the cylinder 70 is activated, the piston 71 extends moving the slideable block 78b upwards along the upright members 77 to bring the first nip roller 61 into nip contact with the web 25. When the cylinder 70 is inactivated, the piston 71 retracts moving the slideable block 78b downward along the upright members 77 and withdrawing the first nip roller 61 from contact with the web 25.

Although only one of the nip rollers 50 needs to move in order to bring the nip rollers 50 into an out of nip contact with the web 25 as shown in FIGS. 3 and 4, it is contemplated that both of the nip rollers 50 can be moved by the means to move the nip rollers. The means to move the nip rollers into and out of nip contact is not limited to the cylinder 70 described above, but any such actuating mechanism which moves at least one of the nip rollers 50 may be employed.

In the embodiments shown, the means for moving 54 the nip rollers 50 also provides for the means for applying 56 pressure. It is contemplated that the means for applying pressure 56 and the means for moving 54 the nip rollers 50 can be separate mechanisms, but the embodiments shown are preferred due to its simplicity. The means for applying pressure 56 includes the pneumatic cylinder 70 with the piston 71. When the second nip roller 62 and the first nip roller 61 are in nip contact with the web 25, the cylinder 70 applies pressure to the second nip roller 62 against the first nip roller 61 (or in the alternate embodiment, the first nip roller 61 applies pressure against the second nip roller 62) gripping the side edge 28 of the web 25 to apply a force to the side edge 28 of the web 25. When the nip rollers 50 of the gripping nip roller assembly 52 at each side edge 28,29 are both in pressured nip contact with the web 25, i.e., gripping both of the side edges, the first force is applied to the web 25 to retain the side edges 28,29 of the web 25 from neckdown. A preferred range of pressure applied by the cylinder 70 is between 10 to 25 psi at each side edge 28,29 of the web 25. In each of the gripping nip roller assemblies 52, the cylinder 70 associated with the assembly 52 applies the same or substantially the same pressure to the nip rollers 50.

The nip rollers 50 are positioned at particular angular orientation to the web 25. The axis 64 of each of the nip rollers 50 is skewed at an angle f between 2 to 30 degrees from the perpendicular (as indicated by line 90) of the film transport direction 35. Preferably the angle f of the nip rollers 50 is 10 to 20 degrees. The first and second nip rollers 61,62 of both gripping nip roller assemblies 52 are positioned at the same angle f. Further, the nip rollers 50 are positioned such that the grip end 66 of each pair of nip rollers 50 is downstream in the film transport direction 35 (and the mount end 65 is upstream). Thus the grip end 66 of the nip rollers 50 is oriented downstream between 2 to 30 degrees from the perpendicular 90 of the film transport direction 35. Alternately stated, the axis 64 of each of the nip rollers 61,62 is at a downstream angle g less than 90 degrees from the film transport direction 35.

Referring to FIGS. 4 and 5, a preferred embodiment of the means for adjusting 58 the angular position of the nip rollers 50 adjusts both the first and second nip rollers 61,62 in unison since both the nip rollers 61,62 are supported by the same structure, i.e., support assembly 69, to the frame. The upright members 77 mounted to the adjustable plate 76 supports the pair of nip rollers 50 and as the adjustable plate 76 rotates, the axis 64 of the pair of nip rollers 50 move to the angle relative to the perpendicular 90 of the film transport direction 35. The slot 85 in the adjustable plate 76 corresponds to the hole 82 in the top side 81 of the support block 75. The angular position 58 of the pair of nip rollers 50 is adjusted by rotating the adjustable plate 76 about a locus which is the passage 86 for the piston 71, moving the position of the slot 85 relative to the hole 82 in the support block 75. When the nip rollers 50 are at the desired angle f, the adjustable plate 76 is secured in place by a screw or bolt 95 which passes through the slot 85 and engages the hole 82. The position on the adjustable plate 76 and the shape and length of the slot 85 relative to the hole 82 in the support block 75 corresponds to the angle f between 2 to 30 degrees which the nip rollers 50 can be adjusted.

Preferably during the initial cooling period in the first cooling zone 40, in addition to the first force applied, at least one second force is applied on the top side 26 of the web 25 perpendicular to the plane of the web 25. That is, the second force is applied on the top side 26 of the web 25 normal to the top side 26. If only one second force is applied to the web 25, it is preferred that the second force is applied prior to the application of the first force, i.e., upstream of the gripping nip roller assemblies 52, in the first cooling zone 40. If more than one second force is applied to the web 25, it is preferred that each of the second forces are spaced apart along the length of the web 25 (in the film transport direction 35) in the first cooling zone 40, with one or more second forces prior, i.e., upstream, to the gripping nip roller assemblies 52 and one or more second forces after, i.e., downstream, the gripping nip roller assemblies 52. It is preferred that there are multiple second forces applied to the web 25, spaced along the web 25 in the film transport direction 35 throughout the first cooling zone 40 as shown in FIGS. 1 and 2. The application of multiple second forces to the web 25 perpendicular to the plane of the web 25 additionally improves the thickness uniformity of the photopolymerizable layer 24 in the cross-web direction. The application of at least one of the second forces to the web 25 can be used for any thickness of the photopolymerizable layer but is particularly suitable for thick photopolymer layers, i.e., photopolymer layers of about 100–250 mils (0.25 to 0.64 cm).

Referring to FIGS. 1 and 2, a means to apply a second force perpendicular to the plane of the web 25 includes a layon roller assembly 102. The layon roller assembly 102 includes a layon roller 104 having a first end 105 and a second end 106, a means for moving 108 the layon roller 104 into and out of contact with the top side 26 of the web 25 and a means for applying pressure 110 to the layon roller 104. The layon roller 104 has a length which preferably extends beyond the each of the side edges 28,29 of the web 25, but can be substantially the same length as the cross-web distance. The layon roller 104 contacts the top side 26 of the web 25 from the first side edge 28 to the second side edge 29 perpendicular 90 to the film transport direction 35. The layon roller 104 is mounted on a shaft 112 by conventional means so that the layon roller 104 freely rotates to allow the web 25 to transport in the film transport direction 35. The shaft 112 extends beyond each of the first and second ends 105,106 of the layon roller 104 and mounts to the means for moving 108 the layon roller 104 into and out of contact with the top side 26 of the web 25. Materials suitable as the layon roller are anodized aluminum and steel.

The means for moving 108 the layon roller 104 is useful for inactivating the layon roller assembly 102 if it is not needed. Preferably the means for moving 108 the layon roller 104 includes a pneumatic cylinder 115 associated with each end 105,106 of the layon roller 104. Each cylinder 115 has a piston 116 which is coupled to the shaft 112 at the first end 105 and the second end 106 of the layon roller 104. The cylinders 115 are mounted to the frame. The cylinders 115 for the layon roller 104 are activated by conventional means so that the pistons 116 are synchronized to move the layon roller 104 toward and retract from the top side 26 of the web 25 at the same time. The means for moving 108 the layon roller 104 is not limited to the pneumatic cylinder 115 described above, but any such activating mechanism which moves the layon roller 104 into and out of contact with the web 25 may be employed.

In the embodiment shown, the means for moving 108 the layon roller 104 also provides for the means for applying pressure 110. It is contemplated that the means for applying pressure 110 and the means for moving 108 the layon roller 104 can be separate mechanisms, but the embodiment shown is preferred due to its simplicity. The means for applying pressure 110 includes the pneumatic cylinders 115 at each end 105, 106 of the layon roller 104. When the layon roller 104 contacts the top side 26 of the web 25, the cylinders 115 apply pressure, exerting the second force onto the web 25. A preferred range of pressure applied by each of the cylinders 115 (in a vertical orientation) for the layon roller 104 is between 0.1 to 3 pounds/lineal inch of roller. Each cylinder 115 applies the same or substantially the same pressure at the ends 105,106 of the layon roller 104. The second force applied to the web 25 by the layon roller 104 preferably deflects the web 25 downward from the film transport path, i.e., towards a space between idler rollers 42. The second force is applied by the layon roller 104 on the top side 26 of the web 25 normal to the top side 26, that is, the second force constitutes a perpendicular force onto the web 25. The second force applied to the web is between about 4.8 to 195 pounds. The second force applied to the web should be sufficient to slightly deflect the web 25 downward from the film transport path, but not so much so as to impede the transport of the web or to cause creasing in the support or coversheet.

It should be understood that the previous description of layon roller assembly 102 as the means for applying the second force to the web 25 is applicable in kind for more than one layon roller assemblies 102.

As is known to those skilled in the art, the cylinders 70,115 can be mounted in any orientation, i.e., vertically or at an angle, and that pressure exerted by the cylinders 70, 115 would be adjusted accordingly to assure that the force applied by the nip roller and layon roller to the web 25 performs as desired to minimize thickness non-uniformity of the photopolymerizable layer 24.

MATERIALS

The support can be any flexible material which is conventionally used with photosensitive elements used to prepare flexographic printing plates. Examples of suitable support materials include polymeric films such those formed by addition polymers and linear condensation polymers, transparent foams and fabrics. A preferred support is a polyester film; particularly preferred is polyethylene terephthalate. The support typically has a thickness from 2 to 10 mils (0.0051 to 0.025 cm), with a preferred thickness of 3 to 8 mils (0.0076 to 0.020 cm).

As used herein, the term "photopolymerizable" is intended to encompass systems which are photopolymerizable, photocrosslinkable, or both. The photopolymerizable layer comprises an elastomeric binder, at least one monomer and an initiator, where the initiator has a sensitivity to actinic radiation. In most cases, the initiator will be sensitive to visible or ultraviolet radiation. Any photopolymerizable compositions which are suitable for the formation of flexographic printing plates can be used for the present invention. Examples of suitable compositions have been disclosed, for example, in Chen et al., U.S. Pat. No. 4,323,637, Grüetzmacher et al., U.S. Pat. No. 4,427,749 and Feinberg et al., U.S. Pat. No. 4,894,315.

The elastomeric binder can be a single polymer or mixture of polymers which can be soluble, swellable or dispersible in aqueous, semi-aqueous or organic solvent developers. Binders which are soluble or dispersible in aqueous or semi-aqueous developers have been disclosed in Alles U.S. Pat. No. 3,458,311; Pohl U.S. Pat. No. 4,442,302; Pine U.S. Pat. No. 4,361,640; Inoue et al., U.S. Pat. No. 3,794,494; Proskow U.S. Pat. No. 4,177,074; Proskow U.S. Pat. No. 4,431,723; and Worns U.S. Pat. No. 4,517,279. Binders which are soluble, swellable or dispersible in organic solvent developers include natural or synthetic polymers of conjugated diolefin hydrocarbons, including polyisoprene, 1,2-polybutadiene, 1,4-polybutadiene, butadiene/acrylonitrile, butadiene/styrene thermoplastic-elastomeric block copolymers and other copolymers. The block copolymers discussed in Chen U.S. Pat. No. 4,323,636; Heinz et al., U.S. Pat. No. 4,430,417; and Toda et al., U.S. Pat. No. 4,045,231 can be used. It is preferred that the binder be present in at least an amount of 65% by weight of the photosensitive layer.

The term binder, as used herein, encompasses core shell microgels and blends of microgels and preformed macromolecular polymers, such as those disclosed in Fryd et al., U.S. Pat. No. 4,956,252.

The photopolymerizable layer can contain a single monomer or mixture of monomers which must be compatible with the binder to the extent that a clear, non-cloudy photosensitive layer is produced. Monomers that can be used in the photopolymerizable layer are well known in the art. Examples of such monomers can be found in Chen U.S. Pat. No. 4,323,636; Fryd et al., U.S. Pat. No. 4,753,865; Fryd et al., U.S. Pat. No. 4,726,877; and Feinberg et al., U.S. Pat. No. 4,894,315. It is preferred that the monomer be present in at least an amount of 5% by weight of the photopolymerizable layer.

The photoinitiator can be any single compound or combination of compounds which is sensitive to non-infrared actinic radiation, generating free radicals which initiate the polymerization of the monomer or monomers without excessive termination. The photoinitiator is generally sensitive to visible or ultraviolet radiation, preferably ultraviolet radiation. The photoinitiator must also be insensitive to infrared radiation and should be thermally inactive at and below 185° C. Examples of suitable photoinitiators include the substituted and unsubstituted polynuclear quinones. Examples of suitable systems have been disclosed in Grüetzmacher U.S. Pat. No. 4,460,675 and Feinberg et al., U.S. Pat. No. 4,894,315. Photoinitiators are generally present in amounts from 0.001% to 10.0% based on the weight of the photopolymerizable composition.

The photopolymerizable layer can contain other additives depending on the final properties desired. Such additives include sensitizers, rheology modifiers, thermal polymerization inhibitors, tackifiers, plasticizers, colorants, antioxidants, antiozonants, or fillers.

The thickness of the photopolymerizable layer can vary over a wide range depending upon the type of printing plate desired. For so called "thin plates" the photopolymerizable layer can be from about 20 to 67 mils (0.05 to 0.17 cm) in thickness. Thicker plates will have a photopolymerizable layer up to 100–250 mils (0.25 to 0.64 cm) in thickness or greater.

Examples of suitable materials for the coversheet include thin films of polyester, polystyrene, polyethylene, polypropylene, polycarbonate, fluoropolymers, and polyamide The support and/or the cover sheet can have one or more additional layers applied to their surface useful for the intended application of the photopolymerizable element.

Those skilled in the art, having benefit of the teachings of the present invention as hereinabove set forth, can effect numerous modifications thereto. These modifications are to be construed as being encompassed within the scope of the present invention as set forth in the appended claims.

We claim:

1. A process for preparing a photopolymerizable printing element comprising:
   (a) feeding into a nip of a calender, a photopolymerizable composition containing at least one elastomeric binder, at least one ethylenically unsaturated monomer, and a photoinitiator;
   (b) calendering the photopolymerizable composition into a layer between a support and a cover element to thereby form a web having a first side edge, a second side edge and a top side;
   (c) applying tension to the web with a pair of driven nip rollers to thereby move the web on a path in a transport direction; and
   (d) cooling the web prior to the driven nip rollers; wherein the improvement comprises, during cooling step (d);
   (e) applying a first force to the web which comprises;
      (e1) gripping the first side edge of the web with a first pair of nip rollers, each of the rollers having an axis and a grip end;
      (e2) gripping the second side edge of the web with a second pair of nip rollers, each of the rollers having an axis and a grip end;
   wherein the axis of each of the first and second pair of nip rollers are skewed at an angle between 2 to 30 degrees from the perpendicular of the transport direction and the grip end of each of the first and second pair of nip rollers are downstream of the transport direction.

2. The process of claim 1 further comprising during the cooling step (d):
   (f) applying at least one second force normal to the top side of the web.

3. The process of claim 2 wherein applying the at least one second force comprises:
   (f1) contacting a layon roller perpendicular to the transport direction onto the web, the layon roller having two ends; and
   (f2) applying pressure at each of the two ends of the layon roller.

4. The process of claim 3 wherein the applying pressure deflects the web from the transport path.

5. The process of claim 1 further comprising the web having an average surface temperature T1 at the end of step (b) and an average surface temperature T2 at the end of step (c) and wherein the applying of the first force occurs during cooling before the web has cooled to an average surface temperature T3 which is less than or equal to (T1–0.5(T1–T2)).

6. The process of claim 1 further comprising the web having an average surface temperature T3 between about 95° and 170° F., wherein the applying of the first force occurs between the end of step b) and to where the web has cooled to the average surface temperature T3.

7. The process of claim 1 wherein the each of the first and second pair of nip rollers have a first nip roller and a second nip roller and wherein gripping further comprises applying pressure with a pneumatic cylinder to the second nip roller between 10 to 25 pounds per square inch.

8. The process of claim 3 wherein the layon roller has a first end and a second end, each end having a pneumatic cylinder for pressing the layon roller between 0.1 to 3 pounds/lineal inch of roller.

9. The process of claim 1 wherein the first force is between 1 to 5 pounds per lineal inch of roller contacting the web.

10. The process of claim 2 wherein the second force is between about 4.8 to 195 pounds.

11. A method of eliminating or reducing non-uniformities in a cross web photopolymerizable sheet, comprising
   (a) calendering a photopolymerizable layer between a support and a coversheet to form the cross-web photopolymerizable sheet wherein the sheet has an initial average surface temperature $T^1$ at point 1;
   (b) passing the sheet through a cooling zone equipped with a force applicator which is applied to side edges of the sheet at an average surface temperature $T^3$ at point 2 which is before tension nip rollers to form a uniform cross web photopolymerizable sheet.

12. A method according to claim 11 wherein $T^1$ is about 185 to 260 F. and point 1 is the point at which the web leaves the calender and $T^3 \leq (T^1-0.5(T^1-T^2))$ wherein $T^2$ is the average surface temperature of the web after passing through the tension nip rollers and is 60–70 F.

13. A method according to claim 12 wherein a second force applicator is applied perpendicular to the film transport direction on the web.

* * * * *